United States Patent
Liu et al.

(10) Patent No.: US 12,096,619 B2
(45) Date of Patent: Sep. 17, 2024

(54) SEMICONDUCTOR STRUCTURE AND MANUFACTURING METHOD THEREOF

(71) Applicant: CHANGXIN MEMORY TECHNOLOGIES, INC., Hefei (CN)

(72) Inventors: Youming Liu, Hefei (CN); Deyuan Xiao, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 241 days.

(21) Appl. No.: 17/816,438

(22) Filed: Aug. 1, 2022

(65) Prior Publication Data

US 2023/0389298 A1 Nov. 30, 2023

Related U.S. Application Data

(63) Continuation of application No. PCT/CN2022/098018, filed on Jun. 10, 2022.

(30) Foreign Application Priority Data

May 31, 2022 (CN) .......................... 202210610523.2

(51) Int. Cl.
H01L 27/108 (2006.01)
H10B 12/00 (2023.01)

(52) U.S. Cl.
CPC ........... H10B 12/485 (2023.02); H10B 12/30 (2023.02); H10B 12/482 (2023.02)

(58) Field of Classification Search
CPC .... H10B 12/485; H10B 12/30; H10B 12/482; H10B 12/05; H10B 12/488
See application file for complete search history.

(56) References Cited

U.S. PATENT DOCUMENTS 5,386,132 A 1/1995 Wong
6,756,652 B2 6/2004 Yano et al.
(Continued)

FOREIGN PATENT DOCUMENTS

CN 1458683 A 11/2003
CN 1499639 A 5/2004
(Continued)

OTHER PUBLICATIONS

International Search Report cited in PCT/CN2022/098247 mailed Dec. 19, 2022, 9 pages.
(Continued)

*Primary Examiner* — Mohammed R Alam
(74) *Attorney, Agent, or Firm* — Kilpatrick Townsend & Stockton LLP

(57) ABSTRACT

The present disclosure provides a semiconductor structure and a manufacturing method thereof, and relates to the technical field of semiconductors, including: a substrate, a first stacked structure is disposed on the substrate, and the first stacked structure includes a memory cell array; a plurality of word lines (WLs), where the WL is disposed in the first stacked structure and is electrically connected to the memory cell array; a plurality of bit lines (BLs), the BL is disposed beside the first stacked structure, and is electrically connected to the memory cell array; and one end of each BL away from the memory cell array forms a step, and the BL includes a first core layer and a first conductive layer covering the first core layer; and a plurality of BL plugs, each BL plug is in corresponding contact with the first conductive layer of one of the BLs.

15 Claims, 8 Drawing Sheets

(56) References Cited

U.S. PATENT DOCUMENTS

| | | | |
|---|---|---|---|
| 6,815,300 | B2 | 11/2004 | Jeong et al. |
| 8,309,416 | B2 | 11/2012 | Park et al. |
| 10,515,981 | B2 | 12/2019 | Or-Bach et al. |
| 11,201,213 | B2 | 12/2021 | Chen |
| 11,398,492 | B2 | 7/2022 | Yan et al. |
| 11,411,007 | B2 | 8/2022 | Lee et al. |
| 11,723,191 | B2 | 8/2023 | Choi et al. |
| 2003/0002359 | A1 | 1/2003 | Kieslich |
| 2003/0139011 | A1 | 7/2003 | Cleeves et al. |
| 2006/0240622 | A1 | 10/2006 | Lee et al. |
| 2007/0228427 | A1 | 10/2007 | Matsui et al. |
| 2012/0161229 | A1 | 6/2012 | Kwon et al. |
| 2012/0168848 | A1 | 7/2012 | Ahn |
| 2013/0052803 | A1 | 2/2013 | Roizin et al. |
| 2013/0264621 | A1 | 10/2013 | Nishi et al. |
| 2015/0228623 | A1 | 8/2015 | Oh et al. |
| 2019/0206869 | A1* | 7/2019 | Kim ............ H01L 29/1033 |
| 2020/0043941 | A1 | 2/2020 | Kim et al. |
| 2020/0083225 | A1 | 3/2020 | Ma et al. |
| 2020/0227416 | A1 | 7/2020 | Lilak et al. |
| 2020/0251151 | A1 | 8/2020 | Kang et al. |
| 2020/0258897 | A1* | 8/2020 | Yan ............ H01L 21/0217 |
| 2020/0266113 | A1 | 8/2020 | Tsugawa |
| 2020/0381450 | A1 | 12/2020 | Lue et al. |
| 2021/0020747 | A1 | 1/2021 | Chen |
| 2021/0151437 | A1 | 5/2021 | Tomishima |
| 2021/0159229 | A1 | 5/2021 | Gomes et al. |
| 2021/0375926 | A1 | 12/2021 | Mehandru et al. |
| 2022/0005809 | A1 | 1/2022 | Kim et al. |
| 2022/0028882 | A1 | 1/2022 | Lee |
| 2022/0130856 | A1 | 4/2022 | Kim et al. |

FOREIGN PATENT DOCUMENTS

| | | |
|---|---|---|
| CN | 102034759 A | 4/2011 |
| CN | 102544016 A | 7/2012 |
| CN | 107623033 A | 1/2018 |
| CN | 108401468 A | 8/2018 |
| CN | 108428703 A | 8/2018 |
| CN | 110875315 A | 3/2020 |
| CN | 110890371 A | 3/2020 |
| CN | 112466881 A | 3/2021 |
| CN | 112838088 A | 5/2021 |
| CN | 113424319 A | 9/2021 |
| CN | 113889473 A | 1/2022 |
| CN | 113972213 A | 1/2022 |
| CN | 114334980 A | 4/2022 |
| CN | 114446963 A | 5/2022 |
| CN | 114497055 A | 5/2022 |
| EP | 3826058 A1 | 5/2021 |
| JP | 2005252283 A | 9/2005 |
| KR | 20090118299 A | 11/2009 |
| KR | 1020190038223 A | 4/2019 |
| KR | 1020220059424 A | 5/2022 |
| TW | 200418168 A | 9/2004 |
| TW | 201643994 A | 12/2016 |
| TW | 202118058 A | 5/2021 |
| TW | 202205539 A | 2/2022 |
| TW | 202218129 A | 5/2022 |
| WO | 2019204795 A1 | 10/2019 |

OTHER PUBLICATIONS

International Search Report cited in PCT/CN2022/098020 mailed Dec. 19, 2022, 9 pages.
International Search Report cited in PCT/CN2022/098018 mailed Dec. 28, 2022, 8 pages.
International Search Report cited in PCT/CN2022/098017 mailed Dec. 19, 2022, 9 pages.
International Search Report cited in PCT/CN2022/097528 mailed Dec. 16, 2022, 8 pages.
International Search Report cited in PCT/CN2022/098249 mailed Dec. 26, 2022, 9 pages.
European Patent Office, Extended European Search Report Issued in Application No. 22924572.5, Jul. 23, 2024, Germany, 8 pages.

* cited by examiner

US 12,096,619 B2

SEMICONDUCTOR STRUCTURE AND MANUFACTURING METHOD THEREOF

CROSS-REFERENCE TO RELATED APPLICATIONS

The present disclosure is a continuation application of International Patent Application No. PCT/CN2022/098018, filed on Jun. 10, 2022, which claims the priority to Chinese Patent Application 202210610523.2, titled "SEMICONDUCTOR STRUCTURE AND MANUFACTURING METHOD THEREOF" and filed with the China National Intellectual Property Administration (CNIPA) on May 31, 2022. The entire contents of International Patent Application No. PCT/CN2022/098018 and Chinese Patent Application 202210610523.2 are incorporated herein by reference.

TECHNICAL FIELD

The present disclosure relates to the technical field of semiconductors, and in particular to a semiconductor structure and a manufacturing method thereof.

BACKGROUND

With the development of semiconductor technologies, the memory, especially a dynamic random access memory (DRAM) is widely used in various electronic devices due to its high storage density and fast reading and writing speed.

The DRAM usually includes a plurality of memory cells. Each memory cell includes a transistor and a capacitor. A gate of the transistor is electrically connected to a word line (WL) of the DRAM. The on and off of the transistor is controlled by the voltage on the WL. One of a source and a drain of the transistor is electrically connected to a bit line (BL), and the other is electrically connected to the capacitor. Data information is stored or outputted by the BL.

To reduce the size of the memory and increase its storage density, the capacitor is usually placed horizontally, which facilitates manufacturing a capacitor with a larger slenderness ratio. Correspondingly, the transistor is also placed horizontally, and the transistor is led out to a BL plug through the BL to be electrically connected to a peripheral circuit. However, the contact resistance between the BL and the BL plug affects the speed of signal propagation, resulting in lower overall performance of the semiconductor structure.

SUMMARY

According to some embodiments, a first aspect of the present disclosure provides a semiconductor structure, including: a substrate, where a first stacked structure is disposed on the substrate, and the first stacked structure includes a memory cell array; a plurality of WLs arranged at intervals and extending along a first direction, where the WL is disposed in the first stacked structure and is electrically connected to the memory cell array, and the first direction is perpendicular to the substrate; a plurality of BLs arranged at intervals and extending along a second direction, where the BL is disposed beside the first stacked structure, and is electrically connected to the memory cell array; and one end of each of the plurality of BLs away from the memory cell array forms a step, and the BL includes a first core layer and a first conductive layer covering the first core layer; and a plurality of BL plugs arranged at intervals and extending along the first direction, where each of the BL plugs is in corresponding contact with the first conductive layer of one of the BLs.

According to some embodiments, a second aspect of the present disclosure provides a manufacturing method of a semiconductor structure, including:

forming a first stacked structure on a substrate, where the first stacked structure includes a memory cell array;

forming, on the substrate, a plurality of WLs arranged at intervals and extending along a first direction, where the WL is disposed in the first stacked structure and is electrically connected to the memory cell array;

forming, on the substrate, a plurality of BLs arranged at intervals and extending along a second direction, where the BL is disposed beside the first stacked structure, and is electrically connected to the memory cell array; and one end of each of the plurality of BLs away from the memory cell array forms a step, and the BL includes a first core layer and a first conductive layer covering the first core layer; and forming a plurality of BL plugs arranged at intervals and extending along the first direction, where each of the BL plugs is in corresponding contact with the first conductive layer of one of the BLs.

DETAILED DESCRIPTION

Figure 1:
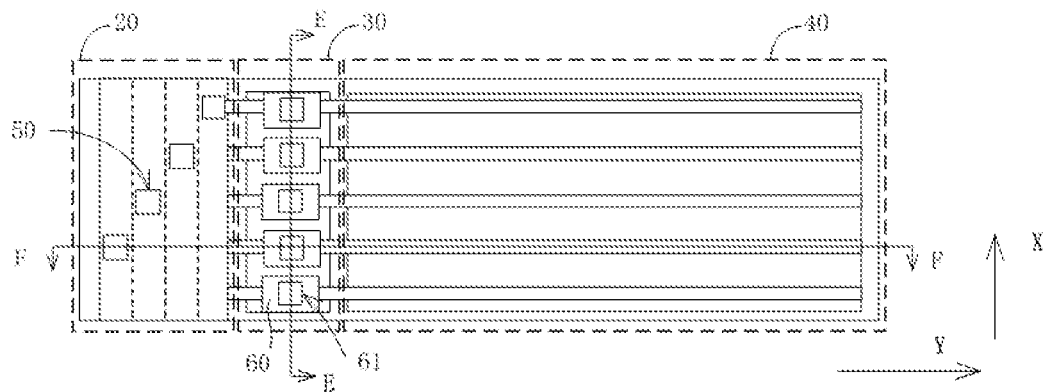
FIG. 1 is a frame diagram of a semiconductor structure according to an embodiment of the present disclosure.

In the related art, the transistor and capacitor are placed horizontally. To connect the transistor to the peripheral circuit, a stepped BL is usually formed at one end of the transistor, and then a BL plug in contact with it is formed on the stepped BL. The BL and the peripheral circuit are electrically connected through the BL plug. The extension direction of the BL is usually perpendicular to that of the BL plug, and a contact area between the BL and the BL plug is limited, resulting in a high contact resistance between them, and reducing the speed of signal propagation, thus decreasing the performance of the semiconductor structure. In addition, in the stepped BLs, the BL is of a horizontal structure, and an insulating material fills a space between adjacent BLs. Therefore, in a normal process, it is difficult to dope the entire BL. As a result, the BL resistance is relatively large, the signal propagation speed is decreased, and the overall performance of the transistor is affected, thus decreasing the performance of the semiconductor structure.

In view of this, the embodiments of the present disclosure provide a semiconductor structure and a manufacturing method thereof. The BL includes a first core layer and a first conductive layer covering the first core layer. The BL plug is in contact with the first conductive layer. The material of the first conductive layer is adjusted, to reduce the contact resistance between the BL plug and first conductive layer and improve the speed of signal propagation, thereby improving the performance of the semiconductor structure. The materials of the first conductive layer and the first core layer are adjusted, to realize ohmic contact between them, thereby reducing the resistance of the BL. In addition, a contact area between the first conductive layer and the first core layer is relatively large, which is beneficial to reducing the contact resistance between them, thereby reducing the resistance of the BL. When the first core layer is formed, a structure filling a space between the first core layers is removed through an etching process, to make the first core layer suspended. Moreover, vapor doping is performed on the first core layer, thereby doping the entire first core layer. It is beneficial to reducing the conductive resistance of the first core layer, thereby further reducing the resistance of the BL.

To make the objectives, features and advantages of the embodiments of the present disclosure clearer, the technical solutions in the embodiments of the present disclosure are described clearly and completely below with reference to the drawings in the embodiments of the present disclosure. Apparently, the described embodiments are merely some rather than all of the embodiments of the present disclosure. All other embodiments obtained by those of ordinary skill in the art based on the embodiments of the disclosure without creative efforts shall fall within the protection scope of the present disclosure.

A first aspect of the embodiments of the present disclosure provides a semiconductor structure. The semiconductor structure may be a memory device or a non-memory device. The memory device may include, for example, a DRAM, a static random access memory (SRAM), a flash memory, an electrically erasable programmable read-only memory (EEPROM), a phase change random access memory (PRAM), or a magneto-resistive random access memory (MRAM). The non-memory device may be a logic device, such as, a micro-processor unit (MPU), a digital signal processor (DSP), or a micro-controller unit (MCU), or a similar device. In the embodiments of the present disclosure, description is made by the DRAM as an example.

Figure 2:
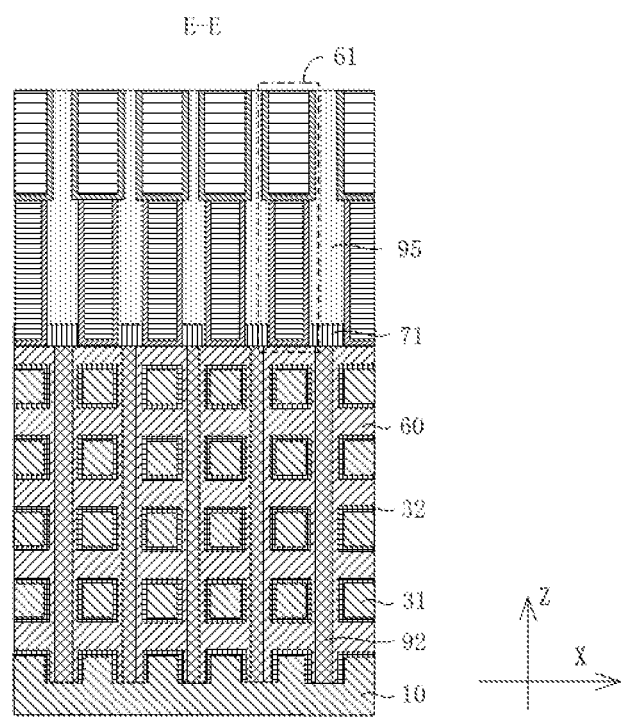
FIG. 2 is a schematic structural diagram of a cross section taken along E-E in FIG. 1.
Figure 3:
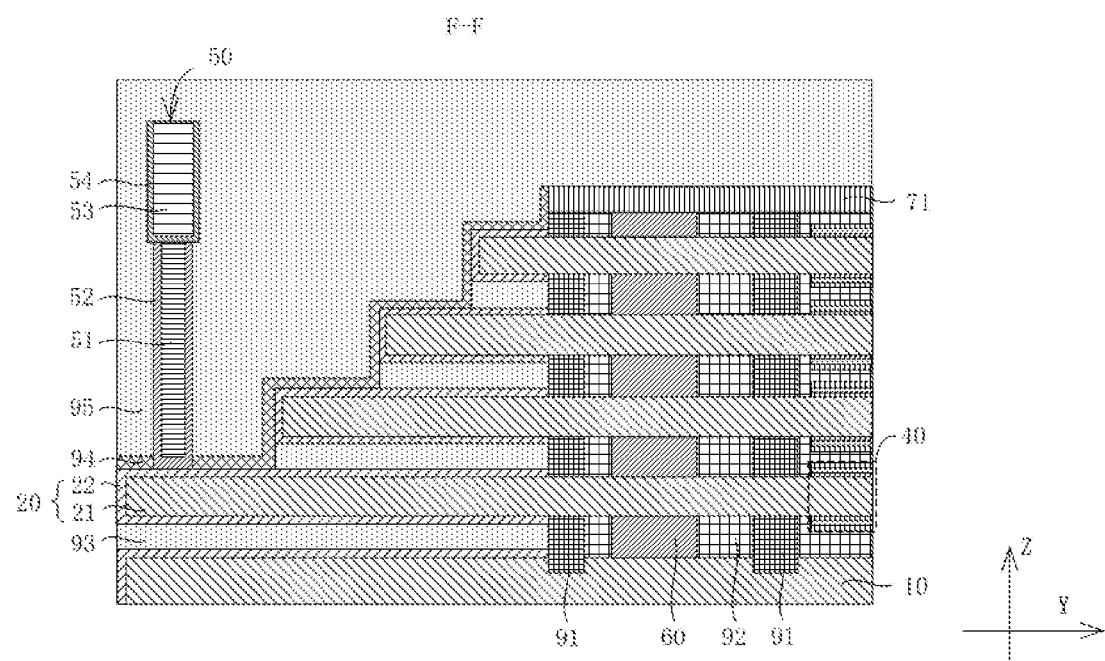
FIG. 3 is a schematic structural diagram of a cross section taken along F-F in FIG. 1.

With reference to FIGS. 1 to 3, the semiconductor structure includes a substrate 10, a WL 60, a BL 20, and a BL plug 50. The substrate 10 is configured for supporting and may be made of a semiconductor such as monocrystalline silicon, polycrystalline silicon, amorphous silicon, germanium, silicon carbide (SiC), silicon germanium (SiGe), germanium on insulator (GOI), silicon on insulator (SOI), or another material known to those skilled in the art.

A first stacked structure is disposed on the substrate 10. The first stacked structure includes a memory cell array, which is configured to store data. The WL 60 extends along the first direction and is disposed in the first stacked structure. The WL 60 is electrically connected to the memory cell array and is configured to control the opening or closing of the memory cell array. The BL 20 extends along the second direction, is electrically connected to the memory cell array, and is configured to write data information into the memory cell array or read data information in the memory cell array. The BL plug 50 is in contact with the BL 20, such that they are electrically connected, thereby electrically connecting the BL 20 to the peripheral circuit.

Specifically, with reference to FIGS. 1 to 3, the memory cell array includes a plurality of transistors 30, and the plurality of transistors 30 are arranged at intervals along the first direction and the second direction, and each transistor extends along a third direction. The third direction is perpendicular to both of the first direction and the second direction.

In some possible embodiments, as shown in FIGS. 1 to 3, the plurality of transistors 30 may be arranged in an array. The plurality of transistors 30 are arranged at intervals not only along the first direction, but also along the second direction. The first direction and the second direction cross each other. The second direction is parallel to the substrate 10. The third direction is also parallel to the substrate 10. The third direction is perpendicular to the first direction and to the second direction.

Any two of the first direction, the second direction, and the third direction are perpendicular to each other, that is, the first direction is also perpendicular to the second direction. For example, the first direction is the direction Z shown in FIG. 2, the second direction is the direction X shown in FIG. 2, and the third direction is the direction Y shown in FIG. 3. In this manner, the plurality of transistors 30 can be arranged more compact, and the arrangement quantity of the transistors 30 can be maximized, thereby improving storage density of the memory cell array.

In some possible embodiments, with reference to FIGS. 2 and 3, the transistor 30 includes a source, a drain, a channel 31, a dielectric layer 32, and a gate. The source or drain is electrically connected to the BL 20. For example, the drain is electrically connected to the BL 20. The channel 31 is disposed between the source and the drain, and the source, the channel 31, and the drain are arranged sequentially along the third direction. The gate surrounds the channel 31 and is electrically connected to the WL 60. A dielectric layer 32 is disposed between the gate and the channel 31.

The material of the source and the drain may be metal or semiconductor, such as molybdenum (Mo) or polysilicon. The material of the channel 31 may be indium gallium zinc oxide (IGZO), SiGe, SiC, or the like. The material of the gate may be metal or its alloy, such as titanium (Ti), titanium nitride (TiN), tungsten (W), aluminum (Al), and the like. The dielectric layer 32 may be made of an insulating material, such as silicon oxide ($SiO_2$), silicon nitride (SiN), silicon oxynitride (SiON), hafnium oxide ($HfO_2$), hafnium silicon oxide ($HfSiO_2$), lanthanum oxide (LaO), zirconium oxide (ZrO$_2$), zirconium oxide silicon (ZrSiO$_2$), tantalum oxide (Ta$_2$O$_5$), titanium oxide (TiO$_2$), barium strontium titanium oxide (BaSrTiO$_3$), barium titanium oxide (BaTiO$_3$), strontium titanium oxide (SrTiO$_3$), lithium oxide (Li$_2$O), alumina (Al$_2$O$_3$), lead scandium tantalum oxide (PbScTaO), lead zinc niobate (PbZnNbO$_3$), or a combination thereof.

In some possible implementations, the plurality of WLs 60 are provided, extend along the first direction (the direction Z in FIG. 2), and are arranged at intervals along the second direction (the direction X in FIG. 2), to ensure that adjacent WLs 60 are electrically isolated, and prevent the WLs 60 from interfering each other. Each WL 60 surrounds the plurality of channels 31 in a same column along the first direction. Each BL 20 connects a plurality of drains located in the same row along the second direction. In such a manner, the arrangement of the WLs 60 and the BLs 20 can be optimized, and they occupy a smaller space, to increase the arrangement quantity of the transistors 30, thereby improving the storage density of the semiconductor structure.

In this case, the WL 60 is used as the gate of the transistor 30 to enable the transistor 30 to be a vertical gate-all-around (GAA) transistor 30. Because the feature size of the vertical GAA transistor is small, when they are disposed in a substrate with a same area, the integration of the semiconductor structure can be improved. At the same time, the channel control ability of the gate and the short channel effect can be also improved.

In some possible embodiments, with reference to FIGS. 1 and 3, the memory cell array further includes a plurality of capacitors 40. The plurality of capacitors 40 are electrically connected to the plurality of transistors 30 in a one-to-one correspondence. The plurality of capacitors 40 extend along the third direction and are arranged at intervals, such that the capacitors 40 are placed horizontally on the substrate 10, and the capacitor 40 is unlikely to collapse, and has a larger slenderness ratio, thereby improving the storage capacity of the semiconductor structure. One of the source and drain of the transistor 30 is connected to the BL 20, and the other is connected to the capacitor 40. For example, the source of the transistor 30 is electrically connected to the BL 20, and the drain of the transistor 30 is electrically connected to the capacitor 40.

In some possible embodiments, with reference to FIGS. 2 and 3, the first stacked structure further includes: a plurality of support layers 91, where the support layer 91 is disposed between two adjacent rows of transistors 30 along the first direction; and an isolation layer 92, where the isolation layer 92 fills the remaining space of the first stacked structure. The remaining space refers to a space between adjacent transistors 30, between adjacent capacitors 40, and between the transistor 30 and the capacitor 40 without the support layer 91. The support layer 91 is disposed, to support the transistor 30, to prevent it from collapsing, and facilitate the stacking of the transistors 30 in the first direction. The isolation layer 92 is disposed to electrically isolate the transistors 30 and the capacitors 40 in the memory cell array and prevent the transistors 30 and the capacitors 40 in the memory cell array from interfering with each other.

In some possible embodiments, a plurality of support layers 91 are arranged at intervals along the third direction, fill spaces between adjacent transistors 30 and are integrated. Specifically, the support layer 91 is disposed on the substrate 10 and is penetrated by the transistor 30, that is, the support layer 91 is substantially in the shape of a mesh with a plurality of mesh holes arranged at intervals. Each transistor 30 passes through one mesh hole of the support layer 91 and fills the mesh hole. In this way, it facilitates manufacturing the support layer 91, and the support layer can prevent the transistor 30 from collapsing. The material of the support layer 91 may be a material that is relatively tough, and is unlikely to collapse or not easy to etch, for example, SiON or SiN, to improve the stability of the first stacked structure.

In some possible embodiments, with reference to FIGS. 1 to 3, in the embodiments of the present disclosure, the plurality of BLs 20 are provided, extend along the second direction (the direction X in FIG. 1), and are stacked along the first direction (the direction Z in FIG. 3) and arranged at intervals, to electrically isolate adjacent BLs 20.

The BL 20 is disposed beside the first stacked structure. For example, with reference to FIG. 1, the BL 20 is disposed on the left side of the first stacked structure, to be electrically connected to the transistor 30 in the first stacked structure. Specifically, the BL 20 and the capacitor 40 are respectively located at opposite sides of the transistor 30 along the third direction (the direction Y shown in FIG. 1). The end of the BL 20 is in contact with the source or the drain of the transistor 30, such that the BL 20 is electrically connected to the transistor 30.

Certainly, the position of the BL 20 is not limited in the embodiment of the present disclosure. For example, the BL 20 may further be disposed at any one of the two opposite sides of the first stacked structure along the second direction. Specifically, the BL 20 may also be disposed on the upper side or the lower side of the first stacked structure as shown in FIG. 1. It should be noted that when the BL 20 is disposed on the upper side or the lower side of the first stacked structure, the BL 20 extends into the first stacked structure, to be electrically connected to the source or drain of the transistor 30 in the first stacked structure. For example, the BL 20 surrounds the source or drain of the transistor 30.

With reference to FIG. 3, one end of each of the plurality of BLs 20 away from the memory cell array forms a step. Specifically, along the direction away from the substrate 10, the lengths of the plurality of BLs 20 are successively reduced, such that one end of each of the plurality of BLs 20 away from the memory cell array forms a step. In this way, in every two adjacent BLs 20, a partial region of the BL 20 close to the substrate 10 is exposed, and is not blocked by the BL 20 away from the substrate 10, such that a BL plug 50 is formed in the exposed partial region of the BL 20, thereby electrically connecting the BL 20 to the peripheral circuit. As shown in FIG. 3, the left side of each BL 20 is exposed, such that the BL plug 50 is formed at the left side of each BL 20.

Specifically, each BL 20 may include a first core layer 21 and a first conductive layer 22 covering the first core layer 21. As shown in FIG. 3, the first conductive layer 22 covers a surface of the first core layer 21 opposite to the first direction and a side surface of the first core layer 21, that is, the first conductive layer 22 covers the exposed surface of the first core layer 21. The material of the first core layer 21 may be a semiconductor, such as silicon. The material of the first conductive layer 22 may be metal, a metal alloy, or a metal-semiconductor compound, such as titanium, nickel, cobalt, molybdenum, aluminum, metal silicide, and the like.

In this way, the materials of the first core layer 21 and the first conductive layer 22 are adjusted, to adjust and adapt their work functions, and realize the ohmic contact between the first core layer 21 and the first conductive layer 22, such that the contact resistance is relatively small, thereby reducing the resistance of the BL 20. In this case, the relatively large contact area between the first core layer 21 and the first conductive layer 22 can also reduce the contact resistance between the first core layer 21 and the first conductive layer 22, to further decrease the resistance of the BL 20.

At least one of the plurality of first core layers 21 is a N-type semiconductor or a P-type semiconductor. In other words, the N-type or P-type doping is performed on at least one of the first core layers 21. In this way, the work function of the first core layer 21 can be adjusted by adjusting the doping concentration of the first core layer 21, such that, on the one hand, the conductive resistance and the resistance of the first core layer 21 can be reduced, and on the other hand, the contact resistance between the first core layer 21 and the first conductive layer 22 can be reduced.

Further, each first core layer 21 is an N-type semiconductor or a P-type semiconductor, such that the contact resistance between each first core layer 21 and its corresponding first conductive layer 22 is reduced, thereby improving the performance of the semiconductor structure. For example, the N-type semiconductor is formed by doping elements such as phosphorus, arsenic, and antimony into the first core layer 21, and the P-type semiconductor is formed by doping elements such as boron, aluminum, and indium into the first core layer 21. Furthermore, the entire first core layer 21 can be doped through a vapor doping process, thereby reducing the resistance of the first core layer 21, and a contact resistance between the first core layer 21 and the first conductive layer 22.

With reference to FIG. 3, in the embodiment of the present disclosure, a plurality of BL plugs 50 are provided, extend along the first direction, and are arranged at intervals along the third direction, such that the BL plugs 50 are isolated from each other, to prevent the BLs 20 from interfering with each other. The plurality of BL plugs 50 are staggered along the second direction. As shown in FIG. 1, a connecting line of the plurality of BL plugs 50 and the second direction form an angle. In this way, the distance between adjacent BL plugs 50 is relatively large, and the mutual interference is small. Lengths of the plurality of BL plugs 50 change in a stepwise manner. In this way, the surfaces of the BL plugs 50 away from the substrate 10 are flush with each other. It facilitates making the connecting line thereon, to connect the peripheral circuit.

The plurality of BL plugs 50 are electrically connected to the plurality of BLs 20 in a one-to-one correspondence. Each BL plug 50 is in corresponding contact with the first conductive layer 22 of one BL 20. The material of the first conductive layer 22 is adjusted, to reduce the contact resistance between the BL plug 50 and first conductive layer 22, thereby reducing the contact resistance between the BL plug 50 and the BL 20.

In some possible embodiments, the BL plug 50 includes a first conductive part, and a second conductive part disposed on the first conductive part. Orthographic projection of the second conductive part on the substrate 10 covers orthographic projection of the first conductive part on the substrate 10.

Specifically, as shown in FIG. 3, the second conductive part is located at a side of the first conductive part away from the substrate 10. The lower surface of the second conductive part is in contact with the upper surface of the first conductive part, and the lower surface of the first conductive part is in contact with the upper surface of the first conductive layer 22. The orthographic projection of the second conductive part on the substrate 10 covers orthographic projection of the first conductive part on the substrate 10. It ensures that the first conductive part is electrically connected to the second conductive part. In the embodiment in which the lengths of the plurality of BL plugs 50 change in a stepwise manner, in a possible implementation, the lengths of the plurality of first conductive parts change in a stepwise manner, and the lengths of the plurality of second conductive parts are the same, such that the surfaces of the first conductive parts away from the substrate 10 are flush with each other. It is beneficial to manufacturing the first conductive part and the second conductive part.

In the embodiment in which the BL plug 50 includes the first conductive part and the second conductive part disposed on the first conductive part, the first conductive part includes a second core layer 51 and a first metal layer 52 covering the second core layer 51. The first metal layer 52 covers the side surface of the second core layer 51 and the surface of the second core layer 51 facing the substrate 10, such that the first metal layer 52 is in contact with the first conductive layer 22, and the first metal layer 52 is in contact with the second conductive part, thereby electrically connecting the first metal layer 52 to the first conductive layer 22, and electrically connecting the first metal layer 52 to the second conductive part.

The first metal layer 52 and the first conductive layer 22 are made of a same material. In this way, the first metal layer 52 is in contact with the first conductive layer 22, or the two layers are integrated. There is no contact surface between the first metal layer 52 and the first conductive layer 22, thereby reducing the contact resistance between the BL 20 and the BL plug 50, and improving the performance of the semiconductor structure.

The second conductive part includes a third core layer 53 and a second metal layer 54 covering the third core layer 53. The second metal layer 54 covers the side surface of the third core layer 53 and the surface of the third core layer 53 facing the substrate 10, such that the second metal layer 54 is in contact with the first metal layer 52, thereby electrically connecting the second metal layer 54 to the first metal layer 52. The second core layer 51 and the third core layer 53 may be made of an insulating material. In this way, on the basis of ensuring the electrical properties of the first conductive part and the second conductive part, the thicknesses of the first metal layer 52 and the second metal layer 54 are reduced, to save the costs. Alternatively, the second core layer 51 and the third core layer 53 may further be made of a conductive material, to further reduce the resistance of the BL plug 50. The second core layer 51 and the first metal layer 52 may be made of a same material or not, and/or the third core layer 53 and the second metal layer 54 may be made of a same material or not. It may be understood that when the second core layer 51 and the first metal layer 52 are made of a same material, the second core layer 51 and the first metal layer 52 are integrated. When the third core layer 53 and the second metal layer 54 are made of a same material, the third core layer 53 and the second metal layer 54 are integrated.

With reference to FIGS. 1 and 2, in some possible embodiments, the semiconductor structure further includes: a first insulating layer 93 filling a space between two adjacent ones of the BLs 20, a first protective layer 94 covering the BLs 20 and the first insulating layer 93, and a second insulating layer 95 filling a space between two adjacent ones of the BL plugs 50 and covering the first stacked structure, where a plurality of WL plugs 61 are arranged at intervals in the second insulating layer 95, and the plurality of WL plugs 61 are electrically connected to the plurality of WLs 60 in a one-to-one correspondence.

Specifically, the first insulating layer 93 may further fill a space between adjacent BLs 20, that is, the BL 20 and the first insulating layer 93 are stacked sequentially and alternately along the first direction. The first insulating layer 93 can not only isolate the BLs 20, but also support the BLs 20, to improve the stability of the BL 20. Specifically, the first protective layer 94 covers the BL 20 and the first insulating layer 93, to prevent the surface of the first conductive layer 22 of the BL 20 away from the substrate 10 from being exposed, and isolate and protect the first conductive layer 22. The first protective layer 94 is formed in a stepped shape and may be made of SiN or SiON. The second insulating layer 95 fills a space between two adjacent BL plugs 50, and covers the first stacked structure, to further ensure the insulating performance between the BL plugs 50. The second insulating layer 95 is made of $SiO_2$.

As shown in FIG. 2, a plurality of WL plugs 61 are arranged at intervals in the second insulating layer 95, and the plurality of WL plugs 61 extend along the first direction, and are electrically connected to the plurality of WLs 60 in a one-to-one correspondence, to connect the WL 60 to the peripheral circuit. It should be noted that the WL plug is not shown in FIG. 3, which is a schematic structural diagram.

In conclusion, in the semiconductor structure provided by the embodiments of the present disclosure, the BL 20 includes a first core layer 21 and a first conductive layer 22 covering the first core layer 21. The BL plug 50 is in contact with the first conductive layer 22. The materials of the BL plug 50 and the first conductive layer 22 are adjusted, to reduce the contact resistance between the BL plug 50 and first conductive layer 22, thereby reducing the contact resistance between the BL plug 50 and the BL 20, and to improve the speed of signal propagation, thereby improving the performance of the semiconductor structure. The materials of the first conductive layer 22 and the first core layer 21 are adjusted, to realize ohmic contact between the first conductive layer 22 and the first core layer 21, thereby reducing the resistance of the BL 20. In addition, a contact area between the first conductive layer 22 and the first core layer 21 is relatively large, which is beneficial to reducing the contact resistance between them, thereby reducing the resistance of the BL 20.

Figure 4:
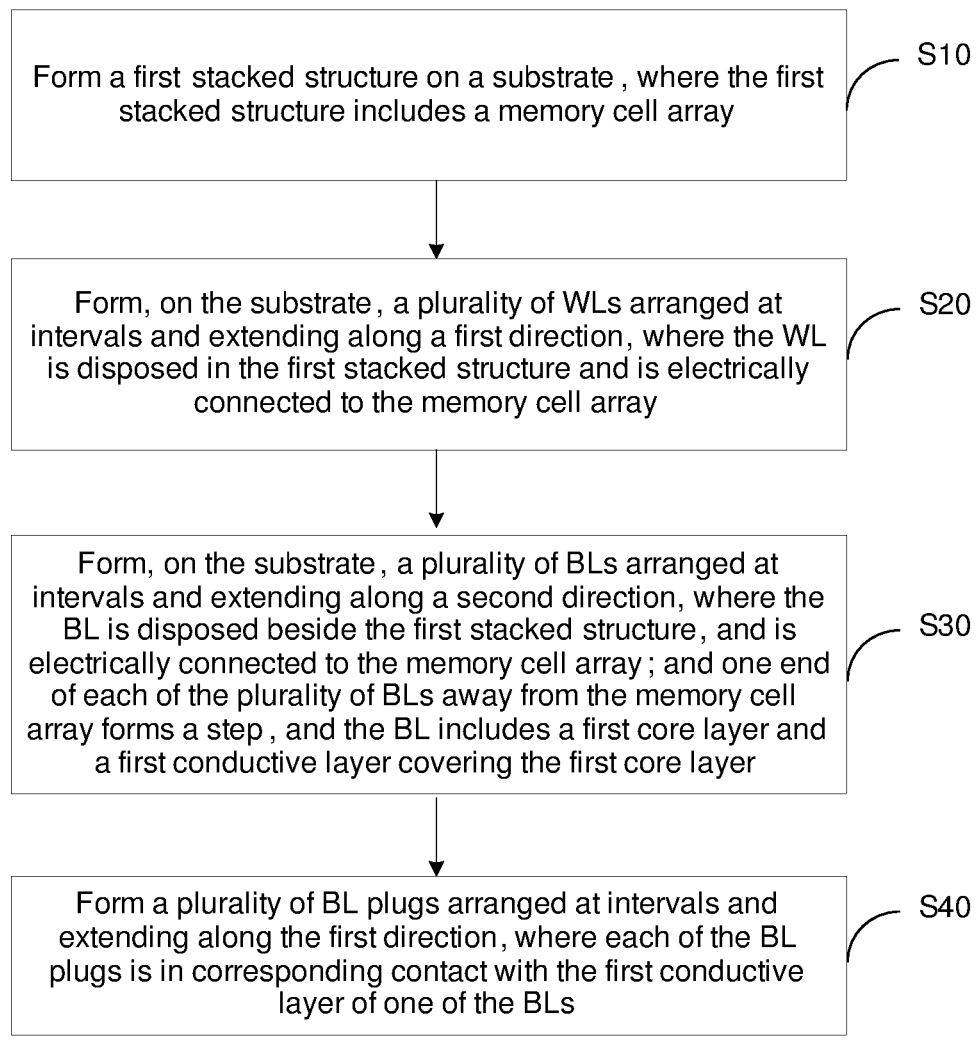
FIG. 4 is a flowchart of a manufacturing method of a semiconductor structure according to an embodiment of the present disclosure.

A second aspect of the embodiments of the present disclosure provides a manufacturing method of a semiconductor structure. With reference to FIG. 4, the manufacturing method includes the following steps:

Step S10: Form a first stacked structure on a substrate, where the first stacked structure includes a memory cell array.

The substrate 10 is configured for supporting. The substrate 10 may be made of a semiconductor, such as, monocrystalline silicon, polycrystalline silicon, amorphous silicon, germanium, SiC, SiGe, GOI, or SOI. A first stacked structure is disposed on the substrate 10. The first stacked structure includes a memory cell array, which is configured to store data. Specifically, with reference to FIGS. 1 to 3, the memory cell array includes a plurality of transistors 30, and the plurality of transistors 30 are arranged at intervals along the first direction and the second direction, and each transistor extends along a third direction. The third direction is perpendicular to both of the first direction and the second direction.

In some possible embodiments, as shown in FIGS. 1 to 3, the plurality of transistors may be arranged in an array. The plurality of transistors 30 are arranged at intervals not only along the first direction, but also along the second direction. The first direction and the second direction cross each other. The second direction is parallel to the substrate 10. The third direction is also parallel to the substrate 10. The third direction is perpendicular to the first direction and to the second direction.

Any two of the first direction, the second direction, and the third direction are perpendicular to each other, that is, the first direction is also perpendicular to the second direction. For example, the first direction is the direction Z shown in FIG. 2, the second direction is the direction X shown in FIG. 2, and the third direction is the direction Y shown in FIG. 3. In this manner, the plurality of transistors 30 can be arranged more compact, and the arrangement quantity of the transistors 30 can be maximized, thereby improving storage density of the memory cell array.

In some possible embodiments, with reference to FIGS. 2 and 3, the transistor 30 includes a source, a drain, a channel 31, a dielectric layer 32, and a gate. The source or drain is electrically connected to the BL 20. For example, the drain is electrically connected to the BL 20. The channel 31 is disposed between the source and the drain, and the source, the channel 31, and the drain are arranged sequentially along the third direction. The gate surrounds the channel 31 and is electrically connected to the WL 60. A dielectric layer 32 is disposed between the gate and the channel 31.

The material of the source and the drain may be metal or semiconductor, such as Mo or polysilicon. The material of the channel 31 may be IGZO, SiGe, SiC, or the like. The material of the gate may be metal or its alloy, such as Ti, TiN, W, Al, and the like. The material of the dielectric layer 32 may be an insulating material, such as $SiO_2$, SiN, SiON, $HfO_2$, $HfSiO_2$, LaO, $ZrO_2$, $ZrSiO_2$, $Ta_2O_5$, $TiO_2$, $BaSrTiO_3$, $BaTiO_3$, $SrTiO_3$, $Li_2O$, $Al_2O_3$, $PbScTaO$, $PbZnNbO_3$, or a combination thereof.

The memory cell array further includes a plurality of capacitors 40. The plurality of capacitors 40 are electrically connected to the plurality of transistors 30 in a one-to-one correspondence. The plurality of capacitors 40 extend along the third direction and are arranged at intervals, such that the capacitors 40 are placed horizontally on the substrate 10, and the capacitor 40 is unlikely to collapse, and has a larger slenderness ratio, thereby improving the storage capacity of the semiconductor structure. One of the source and drain of the transistor 30 is connected to the BL 20, and the other is connected to the capacitor 40. For example, the source of the transistor 30 is electrically connected to the BL 20, and the drain of the transistor 30 is electrically connected to the capacitor 40.

Step S20: Form, on the substrate, a plurality of WLs arranged at intervals and extending along a first direction, where the WL is disposed in the first stacked structure and is electrically connected to the memory cell array.

In some possible implementations, the plurality of WLs 60 are provided, extend along the first direction (the direction Z in FIG. 2), and are arranged at intervals along the second direction (the direction X in FIG. 2), to ensure that adjacent WLs 60 are electrically isolated, and prevent the WLs 60 from interfering each other. Each WL 60 surrounds a plurality of channels 31 located in a same column along the first direction. In such a manner, the arrangement of the WLs 60 can be optimized, and they occupy a smaller space, to increase the arrangement quantity of the transistors 30, thereby improving the storage density of the semiconductor structure. In this case, the WL 60 is used as the gate of the transistor 30 to enable the transistor 30 to be a vertical GAA transistor 30. Because the feature size of the vertical GAA transistor is small, when they are disposed in a substrate 10 with a same area, the integration of the semiconductor structure can be improved. At the same time, the channel 31 control ability of the gate and the short channel 31 effect can be also improved.

In some possible embodiments, after the plurality of WLs 60 arranged at intervals and extending along the first direction are formed on the substrate 10, the method further includes: forming a plurality of support layers 91 and an isolation layer 92, where the support layer 91 is disposed between two adjacent rows of transistors 30 along the first direction; and the isolation layer 92 fills the remaining space of the first stacked structure. The support layer 91 is disposed, to support the transistor 30, to prevent it from collapsing, and facilitate the stacking of the transistors 30 in the first direction. The isolation layer 92 is disposed to electrically isolate the transistors 30 and the capacitors 40 in the memory cell array and prevent the transistors 30 and the capacitors 40 in the memory cell array from interfering with each other.

In some possible embodiments, a plurality of support layers 91 are arranged at intervals along the third direction, fill spaces between transistors 30 and are integrated. For example, the support layer 91 is disposed on the substrate 10, and is penetrated through by the transistor 30. In this way, it facilitates manufacturing the support layer 91, and the support layer can prevent the transistor 30 from collapsing. The material of the support layer 91 may be a material that is relatively tough, and is unlikely to collapse or not easy to etch, for example, SiON or SiN, to improve the stability of the first stacked structure.

Step S30: Form, on the substrate, a plurality of BLs arranged at intervals and extending along a second direction, where the BL is disposed beside the first stacked structure, and is electrically connected to the memory cell array; and one end of each of the plurality of BLs away from the memory cell array forms a step, and the BL includes a first core layer and a first conductive layer covering the first core layer.

With reference to FIGS. 1 to 3, the plurality of BLs 20 are provided, extend along the second direction (the direction X in FIG. 1), and are stacked along the first direction (the direction Z in FIG. 3) and arranged at intervals, to electrically isolate adjacent BLs 20.

With reference to FIG. 3, one end of each of the plurality of BLs 20 away from the memory cell array forms a step. Specifically, along the direction away from the substrate 10, the lengths of the plurality of BLs 20 are successively reduced, such that one end of each of the plurality of BLs 20 away from the memory cell array forms a step. In this way, in every two adjacent BLs 20, a partial region of the BL 20 close to the substrate 10 is exposed, and is not blocked by the BL 20 away from the substrate 10, such that a BL plug 50 is subsequently formed in the exposed partial region of the BL 20, thereby electrically connecting the BL 20 to the peripheral circuit.

In some possible embodiments, each BL 20 may include a first core layer 21 and a first conductive layer 22 covering the first core layer 21. As shown in FIG. 3, the first conductive layer 22 covers a surface of the first core layer 21 opposite to the first direction and a side surface of the first core layer 21, that is, the first conductive layer 22 covers the exposed surface of the first core layer 21. The material of the first core layer 21 may be a semiconductor, such as silicon. The material of the first conductive layer 22 may be metal, a metal alloy, or a metal-semiconductor compound, such as titanium, nickel, cobalt, molybdenum, aluminum, metal silicide, and the like. The materials of the first core layer 21 and the first conductive layer 22 are adjusted, to adjust and adapt their work functions, and realize the ohmic contact between the first core layer 21 and the first conductive layer 22, such that the contact resistance is relatively small. In this case, the relatively large contact area between the first core layer 21 and the first conductive layer 22 can also reduce the contact resistance between the first core layer 21 and the first conductive layer 22.

At least one of the plurality of first core layers 21 is a N-type semiconductor or a P-type semiconductor. In other words, the N-type or P-type doping is performed on at least one of the first core layers 21. In this way, the work function of the first core layer 21 can be adjusted by adjusting the doping concentration of the first core layer 21, such that, on the one hand, the conductive resistance of the first core layer 21 can be reduced, and on the other hand, the contact resistance between the first core layer 21 and the first conductive layer 22 can be reduced.

Further, each first core layer 21 is an N-type semiconductor or a P-type semiconductor, such that the contact resistance between each first core layer 21 and its corresponding first conductive layer 22 is reduced, thereby improving the performance of the semiconductor structure. For example, the N-type semiconductor is formed by doping elements such as phosphorus, arsenic, and antimony into the first core layer 21, and the P-type semiconductor is formed by doping elements such as boron, aluminum, and indium into the first core layer 21. Furthermore, the entire first core layer 21 can be doped through a vapor doping process, thereby reducing the resistance of the first core layer 21, and a contact resistance between the first core layer 21 and the first conductive layer 22.

In some possible implementations, with reference to FIGS. 5 to 12, the step of forming, on the substrate 10, the plurality of BLs 20 arranged at intervals and extending along the second direction, where the BL 20 is disposed beside the first stacked structure, and is electrically connected to the memory cell array includes the following steps:

Step S31: Form a second stacked structure on the substrate, where the second stacked structure is located beside the first stacked structure; and the second stacked structure includes a sacrificial layer and an active layer that are disposed sequentially and alternately.

Figure 5:
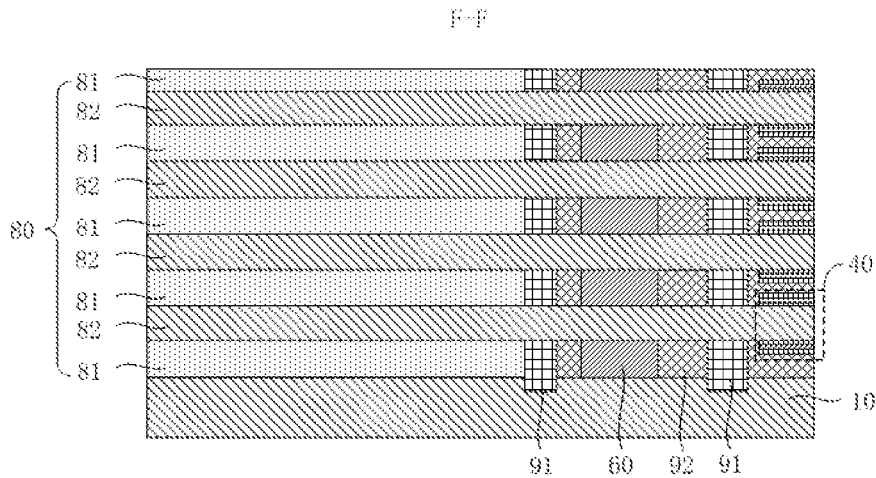
FIG. 5 is a schematic diagram after a second stacked structure is formed according to an embodiment of the present disclosure.

With reference to FIG. 5, the second stacked structure 80 includes a plurality of sacrificial layers 81 and a plurality of active layers 82. The plurality of sacrificial layers 81 and the plurality of active layers 82 are stacked alternately along the first direction. Along the first direction, the active layer 82 is disposed between two adjacent sacrificial layers 81, or the sacrificial layer 81 is disposed between two adjacent active layers 82, such that the sacrificial layers 81 and the active layers 82 are disposed sequentially and alternately. In this arrangement, two adjacent active layers 82 can be isolated by the sacrificial layer 81, to electrically isolate the active layers 82 along the first direction.

As shown in FIG. 5, in some possible embodiments, the innermost layer in the second stacked structure 80 close to the substrate 10 is the sacrificial layer 81. In this way, the active layers 82 can all subsequently form the first core layers 21, increasing the quantity of the first core layers 21. The outermost layer in the second stacked structure 80 away from the substrate 10 is also the sacrificial layer 81. In this way, the sacrificial layer 81 can protect the active layer 82 from being oxidized.

In some possible implementations, the sacrificial layer 81 and the active layer 82 may be formed through a deposition process, such as a chemical vapor deposition (CVD), a physical vapor deposition (PVD), an atomic layer deposition (ALD), or the like. In some other possible implementations, the sacrificial layer 81 and the active layer 82 may further be formed through an epitaxy (EPI) process. The material of the active layer 82 includes silicon, and the material of the sacrificial layer 81 includes SiGe.

Step S32: Remove a part of the sacrificial layer and a part of the active layer that are away from the first stacked structure, and take the remaining active layer as a step, to form the first core layer.

In some possible embodiments, with reference to FIGS. 6 to 11, a first mask layer 72 is formed on the second stacked structure 80. The size of the first mask layer 72 is gradually confined to etch the sacrificial layer 81 and the active layer 82, such that the active layers 82 form steps.

Figure 6:
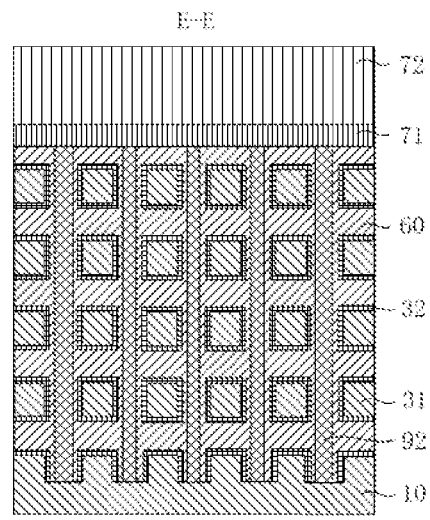
FIG. 6 is a schematic diagram after a first mask layer is formed on a first stacked structure according to an embodiment of the present disclosure.
Figure 7:
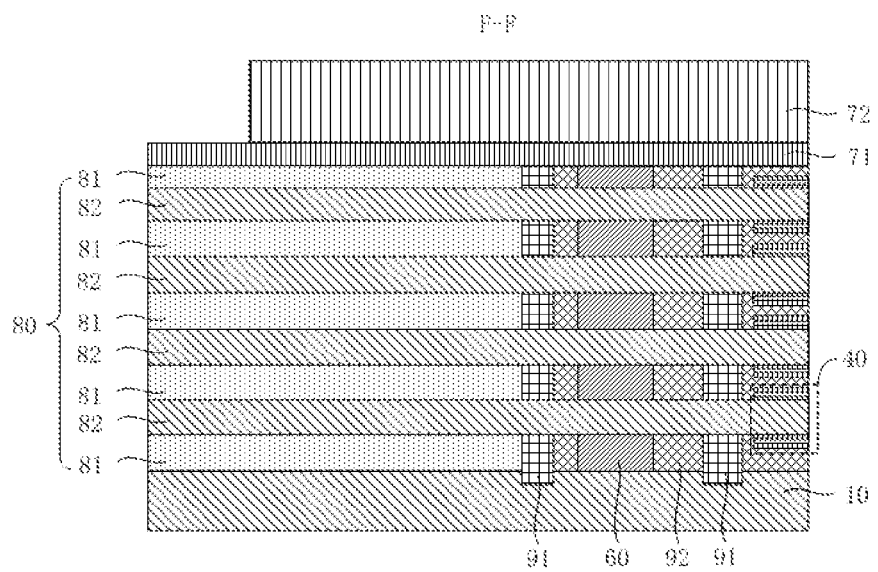
FIG. 7 is a schematic diagram after the first mask layer is formed on the second stacked structure according to an embodiment of the present disclosure.
Figure 8:
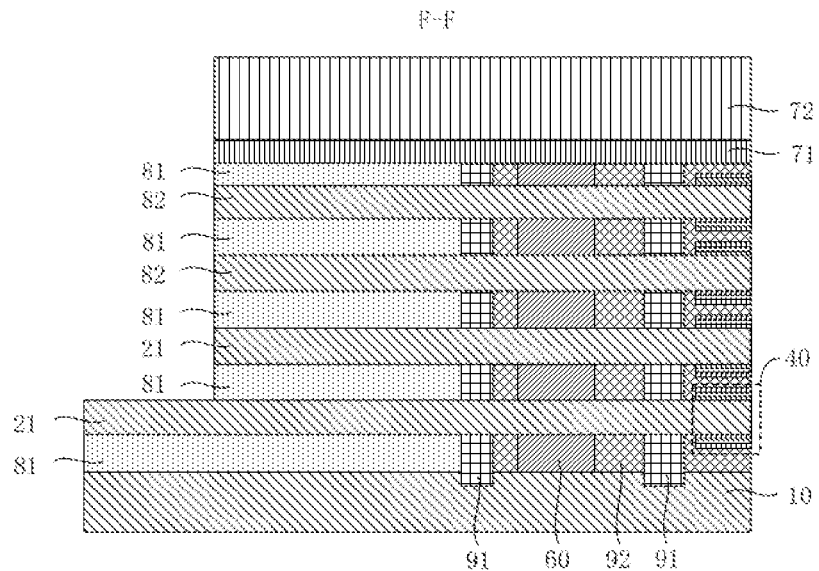
FIG. 8 is a schematic diagram after a penultimate second sacrificial layer and active layer are etched according to an embodiment of the present disclosure.
Figure 9:
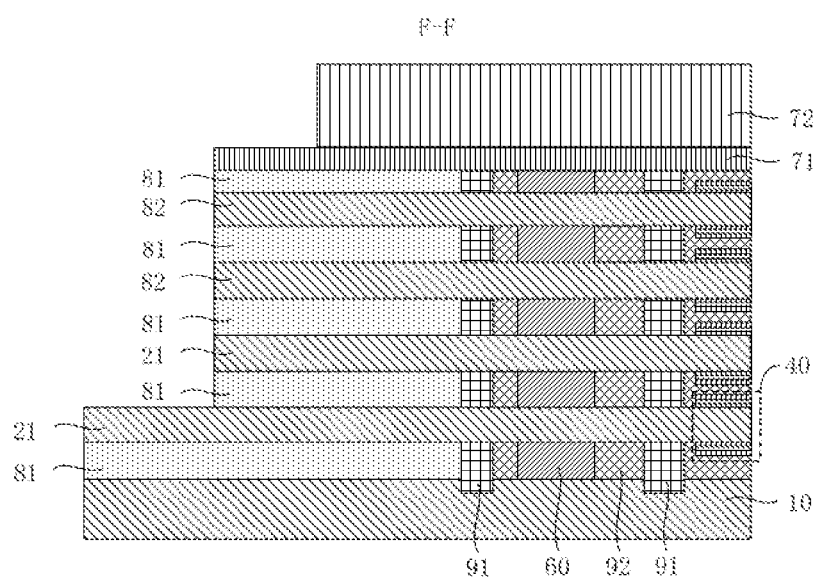
FIG. 9 is a schematic diagram after the first mask layer is confined according to an embodiment of the present disclosure.
Figure 10:
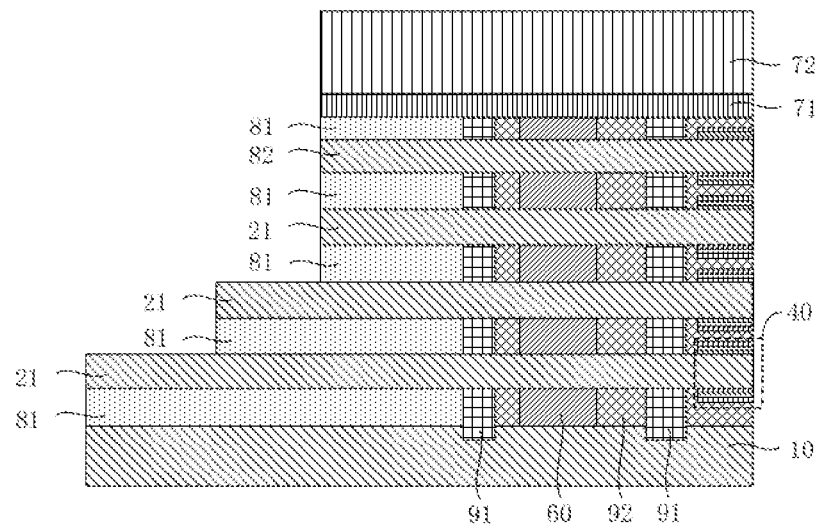
FIG. 10 is a schematic diagram after a penultimate third sacrificial layer and active layer are etched according to an embodiment of the present disclosure.
Figure 11:
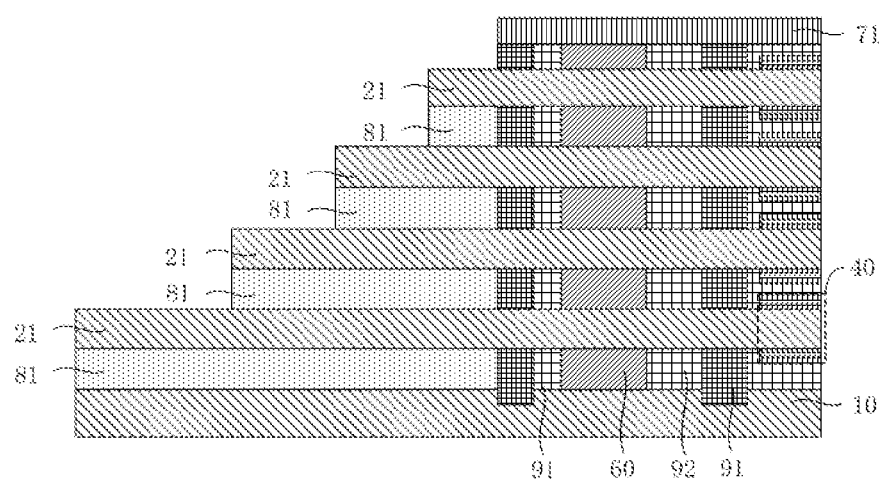
FIG. 11 is a schematic diagram after a topmost sacrificial layer and active layer are etched according to an embodiment of the present disclosure.

Specifically, with reference to FIGS. 6 and 7, the first mask layer 72 is formed on the first stacked structure and the second stacked structure 80. The first mask layer 72 formed on the second stacked structure 80 is provided with a required pattern, to expose a part of the second stacked structure 80. With reference to FIG. 8, the first mask layer 72 is used as a mask layer, to etch through the topmost sacrificial layer 81 and active layer 82 to the penultimate second sacrificial layer 81 and active layer 82. In other words, the bottommost sacrificial layer 81 and active layer 82 are each still of an integral structure, and the bottommost sacrificial layer and the penultimate second sacrificial layer 81 each form a first core layer 21. With reference to FIG. 9, a part of the first mask layer 72 away from the first stacked structure is removed, to confine the first mask layer. With reference to FIG. 10, the confined first mask layer 72 is used as a mask, to etch through the topmost sacrificial layer 81 and active layer 82 to the penultimate third sacrificial layer 81 and the active layer 82, to make the penultimate third active layer 82 form a first core layer 21. With reference to FIG. 11, the confining of the first mask layer 72 and the etching on the corresponding sacrificial layer 81 and active layer 82 are repeated, until the topmost active layer 82 forms a first core layer 21. At last, the remaining first mask layer 72 is removed.

Specifically, in some other possible implementations, the first mask layer 72 is formed on the first stacked structure and the second stacked structure 80, and the first mask layer 72 formed on the second stacked structure 80 has a required pattern, to expose a part of the second stacked structure 80. Alternatively, the first mask layer 72 is used as a mask, to etch the topmost sacrificial layer 81 and active layer 82. A part of the first mask layer 72 away from the first stacked structure is removed, to confine the first mask layer 72. The confined first mask layer 72 is used as a mask to etch through the topmost sacrificial layer 81 and active layer 82 to the second topmost sacrificial layer 81 and active layer 82. The processes of confining the first mask layer 72 and etching the sacrificial layers 81 and the active layers 82 are repeated, until the topmost sacrificial layer 81 and active layer 82 are etched through to the bottommost sacrificial layer 81 and active layer 82. In this case, the all active layers 82 form the first core layers 21. At last, the remaining first mask layer 72 is removed. In the foregoing manufacturing process, the sacrificial layers 81 and the active layers 82 are etched by a same thickness, which is beneficial to forming the steps.

In some possible embodiments, the step of forming the first mask layer 72 on the second stacked structure 80 includes: forming a second protective layer 71 on the first stacked structure and the second stacked structure 80, and forming the first mask layer 72 on the second protective layer 71. The material of the second protective layer 71 is relatively tough. When the second stacked structure 80 is etched, the pattern on the first mask layer 72 is first transferred to the second protective layer 71. The patterned second protective layer 71 in the subsequent etching process can ensure the accuracy of transferred pattern. Then, the second stacked structure 80 is etched by the patterned second protective layer 71, to improve the consistency between the pattern formed in the second stacked structure 80 and the pattern in the first mask layer 72, thereby improving the precision of the semiconductor structure.

Step S33: Remove the remaining sacrificial layer.

Figure 12:
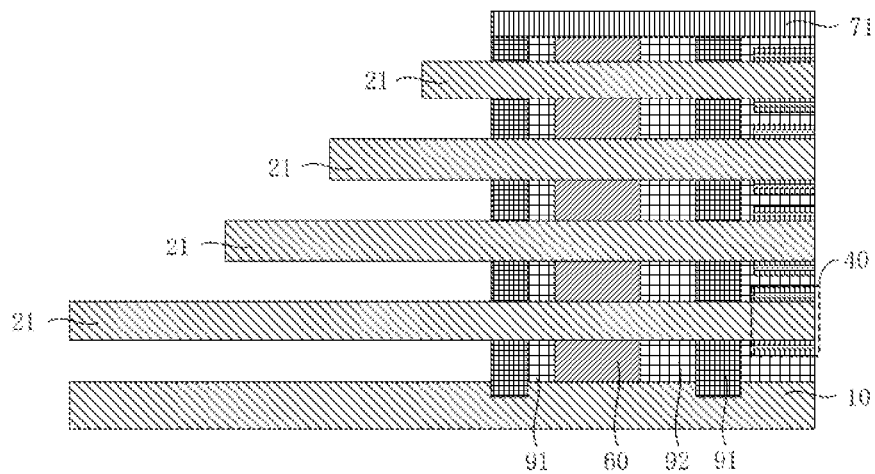
FIG. 12 is a schematic diagram after the sacrificial layer is removed according to an embodiment of the present disclosure.

With reference to FIGS. 11 and 12, the remaining sacrificial layer 81 is removed through a dry-etching or wet-etching process, to make each first core layer 21 suspended, such that the exposed surface area of the first core layer 21 is increased. It is beneficial to doping the entire first core layer 21 subsequently, and reducing the conductive resistance of the first core layer 21, thereby decreasing the resistance of the BL 20.

Step S34: Form the first conductive layer covering the first core layer.

Figure 13:
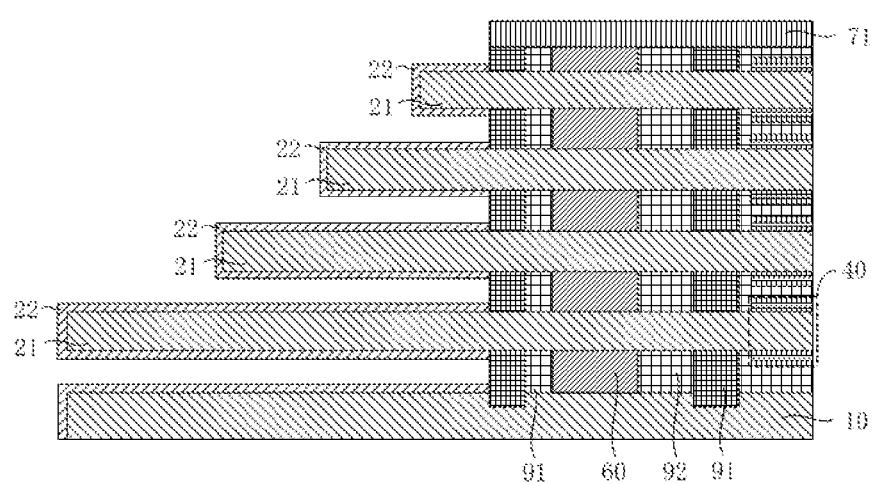
FIG. 13 is a schematic diagram after a first conductive layer is formed according to an embodiment of the present disclosure.

With reference to FIG. 13, a first conductive layer 22 is formed, through an atomic-layer deposition process, on two opposite surfaces of the first core layer 21 along the first direction and on the surface of the first core layer 21 away from the first stacked structure. The first conductive layer 22 covers the first core layer 21. The material of the first core layer 21 may be a semiconductor, such as silicon. The material of the first conductive layer 22 may be metal, a metal alloy, or a metal-semiconductor compound, such as titanium, nickel, cobalt, molybdenum, aluminum, metal silicide, and the like. The materials of the first core layer 21 and the first conductive layer 22 are adjusted, to adjust and adapt their work functions, and realize the ohmic contact between the first core layer 21 and the first conductive layer 22, such that the contact resistance is relatively small. In this case, the relatively large contact area between the first core layer 21 and the first conductive layer 22 can also reduce the contact resistance between the first core layer 21 and the first conductive layer 22.

Figure 14:
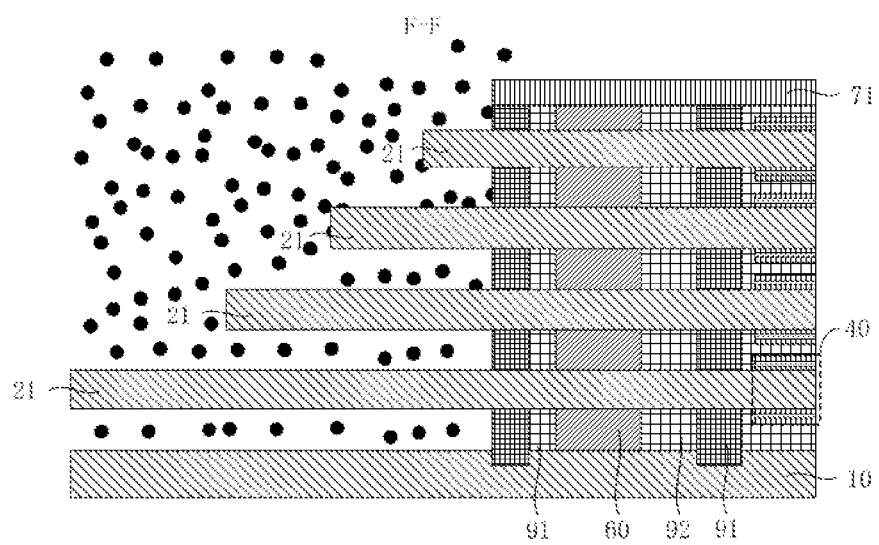
FIG. 14 is a schematic diagram of performing vapor doping on a first core layer according to an embodiment of the present disclosure.

In some possible embodiments, with reference to FIG. 14, before the first conductive layer 22 covering the first core layer 21 is formed, the method further includes: performing N-type or P-type doping on the first core layer 21 through a vapor doping process, to reduce a resistance of the first core layer 21.

Specifically, at least one of the plurality of first core layers 21 is a N-type semiconductor or a P-type semiconductor. In this way, the work function of the first core layer 21 can be adjusted by adjusting the doping concentration of the first core layer 21, such that, on the one hand, the conductive resistance of the first core layer 21 can be reduced, and on the other hand, the contact resistance between the first core layer 21 and the first conductive layer 22 can be reduced. Each first core layer 21 is an N-type semiconductor or a P-type semiconductor, such that the contact resistance between each first core layer 21 and its corresponding first conductive layer 22 is reduced, thereby improving the performance of the semiconductor structure. For example, the N-type semiconductor is formed by doping elements such as phosphorus, arsenic, and antimony into the first core layer 21, and the P-type semiconductor is formed by doping elements such as boron, aluminum, and indium into the first core layer 21. Furthermore, the entire first core layer 21 can be doped with phosphorus elements through a vapor doping process, thereby reducing the resistance of the first core layer 21, and a contact resistance between the first core layer 21 and the first conductive layer 22.

In some possible implementations, the material of the active layer 82 includes silicon. The N-type or P-type doping is performed on the first core layer 21 through a vapor doping process, to reduce the resistance of the first core layer 21. In some embodiments, when first core layer 21 is doped with phosphorus elements, the method includes: under a vapor condition of phosphorus oxychloride ($POCl_3$), doping phosphorus atoms into the first core layer 21 by a thermal diffusion process, and forming a phospho-silicate glass (PSG) on a surface of the first core layer 21; and removing the PSG through etching, to expose the doped first core layer 21. Because the two opposite surfaces of the first core layer 21 along the first direction are exposed, the two surfaces of the first core layer 21 can be doped simultaneously through the vapor doping, such that the first core layer 21 is completely doped, to improve the doping efficiency and uniformity. The thermal diffusion process is performed at 800° C. to 1000° C. Then, the PSG is formed on the surface of the first core layer 21. In this case, the PSG is removed by hydrofluoric acid.

Step S40: Form a plurality of BL plugs arranged at intervals and extending along the first direction, where each of the BL plugs is in corresponding contact with the first conductive layer of one of the BLs.

With reference to FIG. 3, a plurality of BL plugs 50 are provided, extend along the first direction, and are arranged at intervals along the third direction, such that the BL plugs 50 are isolated from each other, to prevent the BLs 20 from interfering with each other. The plurality of BL plugs 50 are staggered along the second direction. As shown in FIG. 1, a connecting line of the plurality of BL plugs 50 and the second direction form an angle. In this way, the distance between adjacent BL plugs 50 is relatively large, and the mutual interference is small. Lengths of the plurality of BL plugs 50 change in a stepwise manner. In this way, the surfaces of the BL plugs 50 away from the substrate 10 are flush with each other. It facilitates making the connecting line thereon, to connect the peripheral circuit.

The plurality of BL plugs 50 are electrically connected to the plurality of BLs 20 in a one-to-one correspondence. Each BL plug 50 is in corresponding contact with the first conductive layer 22 of one BL 20. The material of the first conductive layer 22 is adjusted, to reduce the contact resistance between the BL plug 50 and first conductive layer 22, thereby reducing the contact resistance between the BL plug 50 and the BL 20.

In some possible embodiments, the BL plug 50 includes a first conductive part, and a second conductive part disposed on the first conductive part. Orthographic projection of the second conductive part on the substrate 10 covers orthographic projection of the first conductive part on the substrate 10.

Specifically, as shown in FIG. 3, the second conductive part is located at a side of the first conductive part away from the substrate 10. The lower surface of the second conductive part is in contact with the upper surface of the first conductive part, and the lower surface of the first conductive part is in contact with the upper surface of the first conductive layer 22. The orthographic projection of the second conductive part on the substrate 10 covers orthographic projection of the first conductive part on the substrate 10. It ensures that the first conductive part is electrically connected to the second conductive part. In the embodiment in which the lengths of the plurality of BL plugs 50 change in a stepwise manner, in a possible implementation, the lengths of the plurality of first conductive parts change in a stepwise manner, and the lengths of the plurality of second conductive parts are the same, such that the surfaces of the first conductive parts away from the substrate 10 are flush with each other. It is beneficial to manufacturing the first conductive part and the second conductive part.

In the embodiment in which the BL plug 50 includes the first conductive part and the second conductive part disposed on the first conductive part, the first conductive part includes a second core layer 51 and a first metal layer 52 covering the second core layer 51. The first metal layer 52 covers the side surface of the second core layer 51 and the surface of the second core layer 51 facing the substrate 10, such that the first metal layer 52 is in contact with the first conductive layer 22, and the first metal layer 52 is in contact with the second conductive part, thereby electrically connecting the first metal layer 52 to the first conductive layer 22, and electrically connecting the first metal layer 52 to the second conductive part.

The first metal layer 52 and the first conductive layer 22 are made of a same material. In this way, the first metal layer 52 is in contact with the first conductive layer 22, or the two layers are integrated. There is no contact surface between the first metal layer 52 and the first conductive layer 22, thereby reducing the contact resistance between the BL 20 and the BL plug 50, and improving the performance of the semiconductor structure.

The second conductive part includes a third core layer 53 and a second metal layer 54 covering the third core layer 53. The second metal layer 54 covers the side surface of the third core layer 53 and the surface of the third core layer 53 facing the substrate 10, such that the second metal layer 54 is in contact with the first metal layer 52, thereby electrically connecting the second metal layer 54 to the first metal layer 52. The second core layer 51 and the third core layer 53 may be made of an insulating material. In this way, on the basis of ensuring the electrical properties of the first conductive part and the second conductive part, the thicknesses of the first metal layer 52 and the second metal layer 54 are reduced, to save the costs.

In some possible embodiments, after the plurality of BL plugs 50 arranged at intervals and extending along the first direction are formed, where each of the BL plugs 50 is in corresponding contact with the first conductive layer 22 of one of the BLs 20 (step S40), the method further includes:

forming a first insulating layer 93 filling a space between the BLs 20, and forming a first protective layer 94 covering the BLs 20 and the first insulating layer 93; and forming a second insulating layer 95 filling a space between the BL plugs 50 and covering the first stacked structure, where a plurality of WL plugs 61 are arranged at intervals in the second insulating layer 95, and each of the WL plugs 61 is electrically connected to a WL 60.

Specifically, with reference to FIG. 4, the first insulating layer 93 may further fill a space between adjacent BLs 20, that is, the BL 20 and the first insulating layer 93 are stacked sequentially and alternately along the first direction. The first insulating layer 93 can not only isolate the BLs 20, but also support the BLs 20, to improve the stability of the BL 20. Specifically, the first protective layer 94 covers the BL 20 and the first insulating layer 93, to prevent the surface of the first conductive layer 22 of the BL 20 away from the substrate 10 from being exposed, and isolate and protect the first conductive layer 22. The first protective layer 94 is formed in a stepped shape and may be made of SiN or SiON. The second insulating layer 95 fills a space between two adjacent BL plugs 50, and covers the first stacked structure, to further ensure the insulating performance between the BL plugs 50. The second insulating layer 95 is made of SiO$_2$. The plurality of WL plugs 61 are arranged at intervals in the second insulating layer 95, extend along the first direction, and are electrically connected to the plurality of WLs 60 in a one-to-one correspondence, to connect the WL 60 to the peripheral circuit.

In conclusion, in the manufacturing method of a semiconductor structure provided by the embodiments of the present disclosure, the BL 20 is formed, and includes the first core layer 21 and the first conductive layer 22 covering the first core layer 21. In addition, the BL plug 50 in contact with the first conductive layer 22 is formed. The materials of the BL plug 50 and the first conductive layer 22 are adjusted, to reduce the contact resistance between the BL plug 50 and first conductive layer 22, and improve the speed of signal propagation, thereby improving the performance of the semiconductor structure, and reducing the contact resistance between the BL plug 50 and the BL 20. The materials of the first conductive layer 22 and the first core layer 21 are adjusted, to realize ohmic contact between the first conductive layer 22 and the first core layer 21, thereby reducing the resistance of the BL 20. In addition, a contact area between the first conductive layer 22 and the first core layer 21 is relatively large, which is beneficial to reducing the contact resistance between them, thereby reducing the resistance of the BL 20. Vapor doping is subsequently performed on the first core layer 21, thereby doping the entire first core layer 21, and reducing the conductive resistance of the first core layer 21, to further reduce the resistance of the BL 20.

The embodiments or implementations of this specification are described in a progressive manner, and each embodiment focuses on differences from other embodiments. The same or similar parts between the embodiments may refer to each other. In the descriptions of this specification, a description with reference to the term "one implementation", "some implementations", "an exemplary implementation", "an example", "a specific example", "some examples", or the like means that a specific feature, structure, material, or characteristic described in combination with the implementation(s) or example(s) is included in at least one implementation or example of the present disclosure. In this specification, the schematic expression of the above terms does not necessarily refer to the same implementation or example. Moreover, the described specific feature, structure, material or characteristic may be combined in an appropriate manner in any one or more implementations or examples.

Finally, it should be noted that the foregoing embodiments are used only to explain the technical solutions of the present disclosure, but are not intended to limit the present disclosure. Although the present disclosure is described in detail with reference to the foregoing embodiments, those of ordinary skill in the art should understand that they can still modify the technical solutions described in the foregoing embodiments, or make equivalent substitutions on some or all technical features therein. The modifications or substitutions do not make the essence of the corresponding technical solutions deviate from the scope of the technical solutions of the embodiments of the present disclosure.

The invention claimed is:

1. A semiconductor structure, comprising:
   a substrate, wherein a first stacked structure is disposed on the substrate, and the first stacked structure comprises a memory cell array;
   a plurality of word lines (WLs) arranged at intervals and extending along a first direction, wherein each of the WLs is disposed in the first stacked structure and is electrically connected to the memory cell array;
   a plurality of bit lines (BLs) arranged at intervals and extending along a second direction, wherein each of the plurality of BLs is disposed beside the first stacked structure, and is electrically connected to the memory cell array; and one end of each of the plurality of BLs away from the memory cell array forms a step, and each of the plurality of BLs comprises a first core layer and a first conductive layer surrounding the first core layer; and
   a plurality of BL plugs arranged at intervals and extending along the first direction, wherein each of the plurality of BL plugs is in corresponding contact with the first conductive layer of one of the plurality of BLs.

2. The semiconductor structure according to claim 1, wherein in a direction away from the substrate, lengths of the plurality of BLs are decreased gradually, such that one end of each of the plurality of BLs away from the memory cell array forms a step.

3. The semiconductor structure according to claim 1, wherein each of the plurality of BL plugs comprises a first conductive part and a second conductive part disposed on the first conductive part; and
   orthographic projection of the second conductive part on the substrate covers orthographic projection of the first conductive part on the substrate.

4. The semiconductor structure according to claim 3, wherein the first conductive part comprises a second core layer and a first metal layer covering the second core layer, and the first metal layer is in contact with the first conductive layer; and
   the first metal layer and the first conductive layer are made of a same material.

5. The semiconductor structure according to claim 1, wherein at least one of the plurality of first core layers is an N-type semiconductor structure or a P-type semiconductor.

6. The semiconductor structure according to claim 1, wherein lengths of the plurality of BL plugs change in a stepwise manner.

7. The semiconductor structure according to claim 1, wherein the memory cell array comprises a plurality of transistors, and the plurality of transistors are arranged at intervals along the first direction and the second direction, and each of the transistors extends along a third direction; and
   the third direction is perpendicular to both of the first direction and the second direction.

8. The semiconductor structure according to claim 7, wherein the transistor comprises:
   a source;
   a drain, wherein the source or the drain is electrically connected to a corresponding one of the plurality of BLs;
   a channel, wherein the channel is disposed between the source and the drain, and the source, the channel, and the drain are arranged sequentially along the third direction;
   a gate, wherein a corresponding one the plurality of WLs surrounds the channel to form the gate; and
   a dielectric layer, disposed between the gate and the channel.

9. The semiconductor structure according to claim 8, wherein each of the plurality of WLs surrounds the plurality of channels located in a same column along the first direction; and the plurality of BLs are arranged at intervals along the first direction, and each of the plurality of BLs is connected to the plurality of drains located in a same row along the second direction.

10. The semiconductor structure according to claim 7, wherein the first stacked structure further comprises:
a plurality of support layers, wherein the support layer is disposed between two adjacent rows of transistors along the first direction; and
an isolation layer, wherein the isolation layer fills a remaining space of the first stacked structure.

11. The semiconductor structure according to claim 1, the semiconductor structure further comprises:
a first insulating layer, filling a space between two adjacent ones of the plurality of BLs, a first protective layer, covering the plurality of BLs and the first insulating layer, and a second insulating layer, filling a space between two adjacent ones of the plurality of BL plugs and covering the first stacked structure, wherein
a plurality of WL plugs are arranged at intervals in the second insulating layer, and the plurality of WL plugs are electrically connected to the plurality of WLs in a one-to-one correspondence.

12. A manufacturing method of a semiconductor structure, comprising:
forming a first stacked structure on a substrate, wherein the first stacked structure comprises a memory cell array;
forming, on the substrate, a plurality of word lines (WLs) arranged at intervals and extending along a first direction, wherein each of the plurality of WLs is disposed in the first stacked structure and is electrically connected to the memory cell array;
forming, on the substrate, a plurality of bit lines (BLs) arranged at intervals and extending along a second direction, wherein each of the plurality of BLs is disposed beside the first stacked structure, and is electrically connected to the memory cell array; and one end of each of the plurality of BLs away from the memory cell array forms a step, and each of the plurality of BLs comprises a first core layer and a first conductive layer surrounding the first core layer; and
forming a plurality of BL plugs arranged at intervals and extending along the first direction, wherein each of the plurality of BL plugs is in corresponding contact with the first conductive layer of one of the plurality of BLs.

13. The manufacturing method according to claim 12, wherein the forming, on the substrate, a plurality of BLs arranged at intervals and extending along a second direction, wherein each of the plurality of BLs is disposed beside the first stacked structure, and is electrically connected to the memory cell array comprises:
forming a second stacked structure on the substrate, wherein the second stacked structure is located beside the first stacked structure; and the second stacked structure comprises a sacrificial layer and an active layer that are disposed alternately;
removing a part of the sacrificial layer and a part of the active layer that are away from the first stacked structure, and taking the remaining active layer as a step in the first direction, to form the first core layer;
removing the remaining sacrificial layer; and
forming the first conductive layer surrounding the first core layer.

14. The manufacturing method according to claim 13, before the forming the first conductive layer surrounding the first core layer, the manufacturing method further comprises:
performing N-type or P-type doping on the first core layer through a vapor doping process, to reduce a resistance of the first core layer.

15. The manufacturing method according to claim 14, wherein a material of the active layer comprises silicon; and
the performing N-type or P-type doping on the first core layer through a vapor doping process, to reduce a resistance of the first core layer comprises:
under a vapor condition of phosphorus oxychloride ($POCl_3$), doping phosphorus atoms into the first core layer by a thermal diffusion process, and forming a phospho-silicate glass (PSG) on a surface of the first core layer; and
removing the PSG through etching, to expose the doped first core layer.

* * * * *